(12) United States Patent
Klang

(10) Patent No.: US 7,595,643 B2
(45) Date of Patent: Sep. 29, 2009

(54) APPARATUS AND METHOD FOR SIMULATING A BATTERY TESTER WITH A FIXED RESISTANCE LOAD

(75) Inventor: James K. Klang, Wheaton, IL (US)

(73) Assignee: Midtronics, Inc., Willowbrook, IL (US)

( * ) Notice: Subject to any disclaimer, the term of this patent is extended or adjusted under 35 U.S.C. 154(b) by 579 days.

(21) Appl. No.: 11/507,157

(22) Filed: Aug. 21, 2006

(65) Prior Publication Data

US 2006/0279288 A1 Dec. 14, 2006

Related U.S. Application Data

(63) Continuation-in-part of application No. 10/705,020, filed on Nov. 11, 2003, now Pat. No. 7,116,109.

(60) Provisional application No. 60/713,168, filed on Aug. 31, 2005.

(51) Int. Cl.
*G01N 27/416* (2006.01)
*G01R 31/36* (2006.01)

(52) U.S. Cl. .................. 324/426; 702/63; 324/429; 320/132

(58) Field of Classification Search .............. 324/426, 324/425, 427, 429, 430, 433; 702/63; 320/132, 320/134.136
See application file for complete search history.

(56) References Cited

U.S. PATENT DOCUMENTS 2,000,665 A  5/1935 Neal ........................ 439/440
2,514,745 A  7/1950 Dalzell ..................... 324/115
3,267,452 A  8/1966 Wolf ........................ 340/249

(Continued)

FOREIGN PATENT DOCUMENTS

DE  29 26 716 B1  1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—Akm E Ullah
*Assistant Examiner*—Alexis Boateng
(74) *Attorney, Agent, or Firm*—Alan G. Rego; Westman, Champlin & Kelly P.A.

(57) ABSTRACT

A method and apparatus for simulating a battery tester with a fixed resistance load, such as a widely used Japanese load tester that rates the strength of Japanese batteries that are categorized under the Japanese Industrial Standard (JIS), are provided. This invention simulates such a device without invoking large current loads, yields familiar results, utilizes an existing database and provides more conclusive testing. The method includes estimating a battery load test voltage as a function of a measured battery dynamic parameter, an open circuit voltage, the load resistance value of the load tester and the battery temperature. A bounceback voltage (BBV) of the battery is also predicted. The BBV, load voltage and battery temperature are utilized to rate the strength of the battery. Also, to improve the accuracy of test results for a substantially discharged battery, one embodiment projects the results of recharging discharged batteries without actually doing so.

14 Claims, 4 Drawing Sheets

U.S. PATENT DOCUMENTS

| | | | | |
|---|---|---|---|---|
| 3,356,936 A | 12/1967 | Smith | | 324/429 |
| 3,562,634 A | 2/1971 | Latner | | 324/427 |
| 3,593,099 A | 7/1971 | Scholl | | 320/127 |
| 3,607,673 A | 9/1971 | Seyl | | 324/425 |
| 3,652,341 A | 3/1972 | Halsall et al. | | 29/623.2 |
| 3,676,770 A | 7/1972 | Sharaf et al. | | 324/430 |
| 3,729,989 A | 5/1973 | Little | | 73/862.192 |
| 3,750,011 A | 7/1973 | Kreps | | 324/430 |
| 3,753,094 A | 8/1973 | Furuishi et al. | | 324/430 |
| 3,796,124 A | 3/1974 | Crosa | | 411/521 |
| 3,808,522 A | 4/1974 | Sharaf | | 324/430 |
| 3,811,089 A | 5/1974 | Strezelewicz | | 324/170 |
| 3,873,911 A | 3/1975 | Champlin | | 324/430 |
| 3,876,931 A | 4/1975 | Godshalk | | 324/429 |
| 3,886,443 A | 5/1975 | Miyakawa et al. | | 324/426 |
| 3,889,248 A | 6/1975 | Ritter | | 340/636.11 |
| 3,906,329 A | 9/1975 | Bader | | 320/134 |
| 3,909,708 A | 9/1975 | Champlin | | 324/431 |
| 3,936,744 A | 2/1976 | Perlmutter | | 324/772 |
| 3,946,299 A | 3/1976 | Christianson et al. | | 320/430 |
| 3,947,757 A | 3/1976 | Grube et al. | | 324/416 |
| 3,969,667 A | 7/1976 | McWilliams | | 324/427 |
| 3,979,664 A | 9/1976 | Harris | | 324/397 |
| 3,984,762 A | 10/1976 | Dowgiallo, Jr. | | 324/430 |
| 3,984,768 A | 10/1976 | Staples | | 324/712 |
| 3,989,544 A | 11/1976 | Santo | | 429/65 |
| 4,008,619 A | 2/1977 | Alcaide et al. | | 73/724 |
| 4,023,882 A | 5/1977 | Pettersson | | 439/426 |
| 4,024,953 A | 5/1977 | Nailor, III | | 206/344 |
| 4,047,091 A | 9/1977 | Hutchines et al. | | 363/59 |
| 4,053,824 A | 10/1977 | Dupuis et al. | | 324/434 |
| 4,056,764 A | 11/1977 | Endo et al. | | 320/101 |
| 4,070,624 A | 1/1978 | Taylor | | 324/772 |
| 4,086,531 A | 4/1978 | Bernier | | 324/772 |
| 4,106,025 A | 8/1978 | Katz | | 343/715 |
| 4,112,351 A | 9/1978 | Back et al. | | 324/380 |
| 4,114,083 A | 9/1978 | Benham et al. | | 340/636.13 |
| 4,126,874 A | 11/1978 | Suzuki et al. | | 396/301 |
| 4,160,916 A | 7/1979 | Papasideris | | 307/10.6 |
| 4,178,546 A | 12/1979 | Hulls et al. | | 324/772 |
| 4,193,025 A | 3/1980 | Frailing et al. | | 324/427 |
| 4,207,611 A | 6/1980 | Gordon | | 701/33 |
| 4,217,645 A | 8/1980 | Barry et al. | | 702/63 |
| 4,280,457 A | 7/1981 | Bloxham | | 123/198 R |
| 4,297,639 A | 10/1981 | Branham | | 324/429 |
| 4,307,342 A | 12/1981 | Peterson | | 324/767 |
| 4,315,204 A | 2/1982 | Sievers et al. | | 322/28 |
| 4,316,185 A | 2/1982 | Watrous et al. | | 340/636.11 |
| 4,322,685 A | 3/1982 | Frailing et al. | | 324/429 |
| 4,351,405 A | 9/1982 | Fields et al. | | 180/65.2 |
| 4,352,067 A | 9/1982 | Ottone | | 324/434 |
| 4,360,780 A | 11/1982 | Skutch, Jr. | | 324/437 |
| 4,361,809 A | 11/1982 | Bil et al. | | 324/426 |
| 4,363,407 A | 12/1982 | Buckler et al. | | 209/3.3 |
| 4,369,407 A | 1/1983 | Korbell | | 324/416 |
| 4,379,989 A | 4/1983 | Kurz et al. | | 320/165 |
| 4,379,990 A | 4/1983 | Sievers et al. | | 322/99 |
| 4,385,269 A | 5/1983 | Aspinwall et al. | | 320/129 |
| 4,390,828 A | 6/1983 | Converse et al. | | 320/153 |
| 4,392,101 A | 7/1983 | Saar et al. | | 320/156 |
| 4,396,880 A | 8/1983 | Windebank | | 320/156 |
| 4,408,157 A | 10/1983 | Beaubien | | 324/712 |
| 4,412,169 A | 10/1983 | Dell'Orto | | 320/123 |
| 4,423,378 A | 12/1983 | Marino et al. | | 324/427 |
| 4,423,379 A | 12/1983 | Jacobs et al. | | 324/429 |
| 4,424,491 A | 1/1984 | Bobbett et al. | | 324/433 |
| 4,459,548 A | 7/1984 | Lentz et al. | | 324/472 |
| 4,514,694 A | 4/1985 | Finger | | 324/429 |
| 4,520,353 A | 5/1985 | McAuliffe | | 340/636.16 |
| 4,521,498 A | 6/1985 | Juergens | | 429/59 |
| 4,564,798 A | 1/1986 | Young | | 320/103 |
| 4,620,767 A | 11/1986 | Woolf | | 439/217 |
| 4,633,418 A | 12/1986 | Bishop | | 702/63 |
| 4,659,977 A | 4/1987 | Kissel et al. | | 320/150 |
| 4,663,580 A | 5/1987 | Wortman | | 320/153 |
| 4,665,370 A | 5/1987 | Holland | | 324/429 |
| 4,667,143 A | 5/1987 | Cooper et al. | | 320/153 |
| 4,667,279 A | 5/1987 | Maier | | 363/46 |
| 4,678,998 A | 7/1987 | Muramatsu | | 324/427 |
| 4,679,000 A | 7/1987 | Clark | | 324/428 |
| 4,680,528 A | 7/1987 | Mikami et al. | | 320/165 |
| 4,686,442 A | 8/1987 | Radomski | | 320/123 |
| 4,697,134 A | 9/1987 | Burkum et al. | | 320/134 |
| 4,707,795 A | 11/1987 | Alber et al. | | 702/63 |
| 4,709,202 A | 11/1987 | Koenck et al. | | 320/112 |
| 4,710,861 A | 12/1987 | Kanner | | 363/46 |
| 4,719,428 A | 1/1988 | Liebermann | | 324/436 |
| 4,723,656 A | 2/1988 | Kiernan et al. | | 206/705 |
| 4,743,855 A | 5/1988 | Randin et al. | | 324/430 |
| 4,745,349 A | 5/1988 | Palanisamy et al. | | 320/125 |
| 4,781,629 A | 11/1988 | Mize | | 439/822 |
| 4,816,768 A | 3/1989 | Champlin | | 324/428 |
| 4,820,966 A | 4/1989 | Fridman | | 320/116 |
| 4,825,170 A | 4/1989 | Champlin | | 324/436 |
| 4,847,547 A | 7/1989 | Eng, Jr. et al. | | 320/153 |
| 4,849,700 A | 7/1989 | Morioka et al. | | 324/427 |
| 4,874,679 A | 10/1989 | Miyagawa | | 429/91 |
| 4,876,495 A | 10/1989 | Palanisamy et al. | | 320/106 |
| 4,881,038 A | 11/1989 | Champlin | | 324/426 |
| 4,888,716 A | 12/1989 | Ueno | | 702/63 |
| 4,907,176 A | 3/1990 | Bahnick et al. | | 364/551.01 |
| 4,912,416 A | 3/1990 | Champlin | | 324/430 |
| 4,913,116 A | 4/1990 | Katogi et al. | | 123/406.32 |
| 4,926,330 A | 5/1990 | Abe et al. | | 701/33 |
| 4,929,931 A | 5/1990 | McCuen | | 340/636.15 |
| 4,931,738 A | 6/1990 | MacIntyre et al. | | 324/435 |
| 4,932,905 A | 6/1990 | Richards | | 439/822 |
| 4,933,845 A | 6/1990 | Hayes | | 710/104 |
| 4,934,957 A | 6/1990 | Bellusci | | 439/504 |
| 4,937,528 A | 6/1990 | Palanisamy | | 324/430 |
| 4,947,124 A | 8/1990 | Hauser | | 324/430 |
| 4,949,046 A | 8/1990 | Seyfang | | 324/427 |
| 4,956,597 A | 9/1990 | Heavey et al. | | 320/129 |
| 4,968,941 A | 11/1990 | Rogers | | 324/428 |
| 4,968,942 A | 11/1990 | Palanisamy | | 324/430 |
| 4,969,834 A | 11/1990 | Johnson | | 439/141 |
| 4,983,086 A | 1/1991 | Hatrock | | 411/259 |
| 5,004,979 A | 4/1991 | Marino et al. | | 324/160 |
| 5,032,825 A | 7/1991 | Kuznicki | | 340/636.15 |
| 5,037,778 A | 8/1991 | Stark et al. | | 228/121 |
| 5,047,722 A | 9/1991 | Wurst et al. | | 324/430 |
| 5,081,565 A | 1/1992 | Nabha et al. | | 362/465 |
| 5,087,881 A | 2/1992 | Peacock | | 324/378 |
| 5,095,223 A | 3/1992 | Thomas | | 307/110 |
| 5,108,320 A | 4/1992 | Kimber | | 439/883 |
| 5,126,675 A | 6/1992 | Yang | | 324/435 |
| 5,130,658 A | 7/1992 | Bohmer | | 324/435 |
| 5,140,269 A | 8/1992 | Champlin | | 324/433 |
| 5,144,218 A | 9/1992 | Bosscha | | 320/139 |
| 5,144,248 A | 9/1992 | Alexandres et al. | | 324/428 |
| 5,159,272 A | 10/1992 | Rao et al. | | 324/429 |
| 5,160,881 A | 11/1992 | Schramm et al. | | 322/7 |
| 5,168,208 A | 12/1992 | Schultz et al. | | 322/25 |
| 5,170,124 A | 12/1992 | Blair et al. | | 324/434 |
| 5,179,335 A | 1/1993 | Nor | | 320/159 |
| 5,194,799 A | 3/1993 | Tomantschger | | 320/103 |
| 5,204,611 A | 4/1993 | Nor et al. | | 320/145 |
| 5,214,370 A | 5/1993 | Harm et al. | | 320/152 |
| 5,214,385 A | 5/1993 | Gabriel et al. | | 324/434 |
| 5,241,275 A | 8/1993 | Fang | | 324/430 |
| 5,254,952 A | 10/1993 | Salley et al. | | 324/429 |
| 5,266,880 A | 11/1993 | Newland | | 320/125 |
| 5,281,919 A | 1/1994 | Palanisamy | | 324/427 |
| 5,281,920 A | 1/1994 | Wurst | | 324/430 |

| Patent No. | Date | Inventor | Class |
|---|---|---|---|
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,410,754 A | 4/1995 | Klotzbach et al. | 370/434 |
| 5,412,308 A | 5/1995 | Brown | 323/267 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,025 A | 7/1995 | Cox | 429/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,675,234 A | 10/1997 | Greene | 340/636.11 |
| 5,677,077 A | 10/1997 | Faulk | 429/90 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,717,336 A | 2/1998 | Basell et al. | 324/430 |
| 5,717,937 A | 2/1998 | Fritz | 713/300 |
| 5,739,667 A | 4/1998 | Matsuda et al. | 320/128 |
| 5,745,044 A | 4/1998 | Hyatt, Jr. et al. | 340/5.23 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,978 A | 6/1998 | Becker | 324/430 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,234 A | 10/1998 | McKinnon | 324/433 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,872,443 A | 2/1999 | Williamson | 320/160 |
| 5,872,453 A | 2/1999 | Shimoyama et al. | 324/431 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636.19 |
| 5,978,805 A | 11/1999 | Carson | 707/10 |
| 5,982,138 A | 11/1999 | Krieger | 320/105 |
| 6,002,238 A | 12/1999 | Champlin | 320/134 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,081,098 A | 6/2000 | Bertness et al. | 320/134 |
| 6,081,109 A | 6/2000 | Seymour et al. | 324/127 |
| 6,087,815 A | 7/2000 | Pfeifer et al. | 323/282 |

| | | | |
|---|---|---|---|
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,100,670 A | 8/2000 | Levesque | 320/150 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,211,651 B1 | 4/2001 | Nemoto | 320/133 |
| 6,215,275 B1 | 4/2001 | Bean | 320/106 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,236,332 B1 | 5/2001 | Conkright et al. | 340/3.1 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,263,268 B1 | 7/2001 | Nathanson | 701/29 |
| 6,271,643 B1 | 8/2001 | Becker et al. | 320/112 |
| 6,275,008 B1 | 8/2001 | Arai et al. | 320/132 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,384,608 B1 | 5/2002 | Namaky | 324/430 |
| 6,388,448 B1 | 5/2002 | Cervas | 324/426 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,424,157 B1 | 7/2002 | Gollomp et al. | 324/430 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,449,726 B1 | 9/2002 | Smith | 713/340 |
| 6,456,045 B1 | 9/2002 | Troy et al. | 320/139 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,477,478 B1 | 11/2002 | Jones et al. | 702/102 |
| 6,495,990 B2 | 12/2002 | Champlin | 320/132 |
| 6,526,361 B1 | 2/2003 | Jones et al. | 702/63 |
| 6,531,848 B1 | 3/2003 | Chitsazan et al. | 320/153 |
| 6,532,425 B1 | 3/2003 | Boost et al. | 702/63 |
| 6,534,993 B2 | 3/2003 | Bertness | 324/433 |
| 6,544,078 B2 | 4/2003 | Palmisano et al. | 439/762 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,600,815 B1 | 7/2003 | Walding | 379/93.07 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,737,831 B2 | 5/2004 | Champlin | 320/132 |
| 6,740,990 B2 | 5/2004 | Tozuka et al. | 307/9.1 |
| 6,759,849 B2 | 7/2004 | Bertness | 324/426 |
| 6,777,945 B2 | 8/2004 | Roberts et al. | 324/426 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,842,707 B2 | 1/2005 | Raichle et al. | 702/62 |
| 6,850,037 B2 | 2/2005 | Bertness | 320/132 |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.08 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,941,234 B2 | 9/2005 | Bertness et al. | 702/63 |
| 7,119,686 B2 | 10/2006 | Bertness et al. | 340/572.1 |
| 2002/0010558 A1 | 1/2002 | Bertness et al. | 702/63 |
| 2002/0171428 A1 | 11/2002 | Bertness | 702/63 |
| 2002/0176010 A1 | 11/2002 | Wallach et al. | 348/362 |
| 2003/0025481 A1 | 2/2003 | Bertness | 324/427 |
| 2003/0036909 A1 | 2/2003 | Kato | 704/275 |
| 2003/0169018 A1 | 9/2003 | Berels et al. | 320/132 |
| 2003/0173971 A1* | 9/2003 | Bertness et al. | 324/441 |
| 2003/0184262 A1 | 10/2003 | Makhija | 320/156 |
| 2003/0184306 A1 | 10/2003 | Bertness et al. | 324/426 |
| 2003/0194672 A1 | 10/2003 | Roberts et al. | 431/196 |
| 2004/0000590 A1 | 1/2004 | Raichle et al. | 235/462.01 |
| 2004/0000893 A1 | 1/2004 | Raichle et al. | 320/135 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/182 |
| 2004/0113588 A1 | 6/2004 | Mikuriya et al. | 320/128 |
| 2004/0145342 A1 | 7/2004 | Lyon | 320/108 |

| | | | |
|---|---|---|---|
| 2005/0254106 A9 | 11/2005 | Silverbrook et al. | ........ 358/539 |

FOREIGN PATENT DOCUMENTS

| | | |
|---|---|---|
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

"Battery Impedance", by E. Willihnganz et al., *Electrical Engineering*, Sep. 1959, pp. 922-925.
"Determining The End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro F.J. et al., *AT&T Bell Laboratories*, 1987 IEEE, Ch. 2477, pp. 128,131.
IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2:629.113. 006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Willihncanz, *The Electrochemical Society*, preprint 79-20, Apr. 1941, pp. 253-258.
National Semiconductor Corporation, "High Q Notch Filter", Mar. 1969, Linear Brief 5, Mar. 1969.
Burr-Brown Corporation, "Design A 60 Hz Notch Filter with the UAF42", Jan. 1994, AB-071, 1994.
"Alligator Clips with Wire Penetrators" *J.S. Popper, Inc.* product information, downloaded from http://www.jspopper.com/, undated.
"#12: LM78S40 Simple Switcher DC to DC Converter", *ITM e-Catalog*, downloaded from http://www.pcbcafe.com, undated.
"Simple DC-DC Converts Allows Use of Single Battery", *Electronix Express*, downloaded from http://www.elexp.com/t_dc-dc.htm, undated.
"DC-DC Converter Basics", *Power Designers*, downloaded from http://www.powederdesigners.com/InforWeb.design_center/articles/DC-DC/converter.shtm, undated.
"Notification of Transmittal of The International Search Report or the Declaration", PCT/US02/29461.
"Improved Impedance Spectroscopy Technique For Status Determination of Production Li/SO$_2$ Batteries" Terrill Atwater et al., pp. 10-113, (1992).
"Notification of Transmittal of The International Search Report or the Declaration", PCT/US03/41561.
"Notification of Transmittal of The International Search Report or the Declaration", PCT/US03/27696.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
Supplementary European Search Report Communication for Appl. No. 99917402.2.
"Dynamic modelling of lead/acid batteries using impedance spectroscopy for parameter identification", Journal of Power Sources, pp. 69-84, (1997).
Notification of Transmittal of the International Search Report for PCT/US03/30707.
"A review of impedance measurements for determination of the state-of-charge or state-of-health of secondary batteries", Journal of Power Sources, pp. 59-69, (1998).
"Search Report Under Section 17" for Great Britain Application No. GB0421447.4.
"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.
"Examination Report" from the U.K. Patent Office for U.K. App. No. 0417678.0.
Wikipedia Online Encyclopedia, Inductance, 2005, http://en.wikipedia.org/wiki/inductance, pp. 1-5, mutual Inductance, pp. 3,4.

\* cited by examiner

APPARATUS AND METHOD FOR SIMULATING A BATTERY TESTER WITH A FIXED RESISTANCE LOAD

The present application claims the benefit of U.S. provisional patent application Serial No. 60/713,168, filed Aug. 31, 2005 and is a continuation-in-part of U.S. patent application Ser. No. 10/705,020, filed Nov. 11, 2003, entitled "APPARATUS AND METHOD FOR SIMULATING A BATTERY TESTER WITH A FIXED RESISTANCE LOAD," the contents of which are hereby incorporated by reference in their entirety.

BACKGROUND OF THE INVENTION

The present invention relates to testing storage batteries. More specifically the present invention relates to simulating a battery tester with a fixed resistance load such as a widely used Japanese load tester that rates the strength of Japanese batteries that are categorized under the Japanese Industrial Standard (JIS). The present invention simulates such a device without invoking large current loads, yields familiar results, utilizes an existing database and provides more conclusive testing.

Electronic battery testers are used to test storage batteries. Various examples of such testers are described in U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUN-AWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/960,117, filed Sep. 20, 2001, entitled IN-VEHICLE BATTERY MONITOR; U.S. Ser. No. 09/908,278, filed Jul. 18, 2001, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 60/330,441, filed Oct. 17, 2001, entitled ELECTRONIC BATTERY TESTER WITH RELATIVE TEST OUTPUT; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 60/341,902, filed Dec. 19, 2001, entitled BATTERY TESTER MODULE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/379,281, filed May 8, 2002, entitled METHOD FOR DETERMINING BATTERY STATE OF CHARGE; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/207,495, filed Jul. 29, 2002, entitled KELVIN CLAMP FOR ELECTRICALLY COUPLING TO A BATTERY CONTACT; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 60/408,542, filed Sep. 5, 2002, entitled BATTERY TEST OUTPUTS ADJUSTED BASED UPON TEMPERATURE; U.S. Ser. No. 10/246,439, filed Sep. 18, 2002, entitled BATTERY TESTER UPGRADE USING SOFTWARE KEY; U.S. Ser. No. 60/415,399, filed Oct. 2, 2002, entitled QUERY BASED ELECTRONIC BATTERY TESTER; and U.S. Ser. No. 10/263,473, filed Oct. 2, 2002, entitled ELECTRONIC BATTERY TESTER WITH RELATIVE TEST OUTPUT; U.S. Ser. No. 60/415,796, filed Oct. 3, 2002, entitled QUERY BASED ELECTRONIC BATTERY TESTER; U.S. Ser. No. 10/271,342, filed Oct. 15, 2002, entitled IN-VEHICLE BATTERY MONITOR; U.S. Ser. No. 10/270,777, filed Oct. 15, 2002, entitled PROGRAMMABLE CURRENT EXCITER FOR MEASURING AC IMMITTANCE OF CELLS AND BATTERIES; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE, U.S. Ser. No. 60/437,255, filed Dec. 31, 2002, entitled REMAINING TIME PREDICTIONS, U.S. Ser. No. 60/437,224, filed Dec. 31, 2002, entitled DISCHARGE VOLTAGE PREDICTIONS, U.S. Ser. No. 10/349,053, filed Jan. 22, 2003, entitled APPARATUS AND METHOD FOR PROTECTING A BATTERY FROM OVERDISCHARGE, U.S. Ser. No. 10/388,855, filed Mar. 14, 2003, entitled ELECTRONIC BATTERY TESTER WITH BATTERY FAILURE TEMPERATURE DETERMINATION, U.S. Ser. No. 10/396,550, filed Mar. 25, 2003, entitled ELECTRONIC BATTERY TESTER, U.S. Ser. No. 60/467,872, filed May 5, 2003, entitled METHOD FOR DETERMINING BATTERY STATE OF CHARGE, U.S. Ser. No. 60/477,082, filed Jun. 9, 2003, entitled ALTERNATOR TESTER, U.S. Ser. No. 10/460,749, filed Jun. 12, 2003, entitled MODULAR BATTERY TESTER FOR SCAN TOOL, U.S. Ser. No. 10/462,323, filed Jun. 16, 2003, entitled ELECTRONIC BATTERY TESTER HAVING A USER INTERFACE TO CONFIGURE A PRINTER, U.S. Ser. No. 10/601,608, filed Jun. 23, 2003, entitled CABLE FOR ELECTRONIC BATTERY TESTER, U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE, which are incorporated herein in their entirety.

In general, battery state of health decisions are based on battery rating standards. Japanese battery manufacturers design and manufacture batteries according to Japanese Industrial Standards (JIS). Lead-acid storage batteries used for purposes such as starting, lighting and ignition of automobiles are defined by standard JIS D 5301. This standard defines performance, testing, construction, and labeling criteria for JIS rated batteries.

One type of Japanese battery tester uses measurements of battery voltage under a resistive load and subsequent recovery voltage to access the viability of JIS rated batteries for further service. This tester encompasses several ranges of battery sizes grouped by JIS numbers and multiple temperature ranges. Depending on the response, the battery is diagnosed, as "good," "replace soon," "replace," etc.

Because this tester has a fixed load resistor that discharges batteries at sizable rates (for example, 150 amperes for 5-6 seconds), the tester is rather bulky and may get hot with repeated tests. Also, waiting for the completion of the load and the recovery time takes a moderate amount of time and further depletes battery charge. Further, this tester has voltage sensing leads that are not directly connected to the battery, and therefore the cables must be ohmically perfect and the current must be exactly known to give the correct voltage reading at the battery terminals. Furthermore, if the tester is to be powered by the battery to be tested, then heavy loads can drain a weak or discharged battery causing the tester to lose sufficient power to keep its control circuits running thereby causing a reset.

Thus, it is desirable to obtain load test results, that the above-described Japanese load tester, and other such load testers, are capable of providing, using a more amenable testing technique.

SUMMARY OF THE INVENTION

A method and apparatus for simulating a battery tester with a fixed resistance load, such as a widely used Japanese load tester that rates the strength of Japanese batteries that are categorized under the Japanese Industrial Standard (JIS), are provided. This invention simulates such a device without invoking large current loads, yields familiar results, utilizes an existing database and provides more conclusive testing. The method includes estimating a battery load test voltage as a function of a measured battery dynamic parameter, an open circuit voltage, the load resistance value of the load tester and the battery temperature. A bounceback voltage (BBV) of the battery is also predicted. The BBV, load voltage and battery temperature are utilized to rate the strength of the battery. Also, to improve the accuracy of test results for a substantially discharged battery, one embodiment projects the results of recharging discharged batteries without actually doing so. In addition, the apparatus and method of the present invention can be employed for non-JIS batteries by using reference CCA (cold cranking amps) ranges for each group size.

DETAILED DESCRIPTION OF THE PREFERRED EMBODIMENTS

The present invention provides an apparatus and method for simulating a battery tester with a fixed resistance load, such as a Japanese load tester that rates the strength of Japanese batteries that are categorized under the Japanese Industrial Standard (JIS). A battery tester of the present invention assesses a dynamic parameter, such as conductance, of a battery rated according to Japanese Industrial Standards (JIS) and, together with the resistance of the tester load to be simulated, an open circuit voltage and the temperature of the JIS rated battery, outputs calculated values that are used to rate the strength of the JIS rated battery by categories of JIS group size numbers. In addition, the tester can be used for non-JIS batteries by using reference CCA (cold cranking amps) ranges for each group size.

Figure 1:
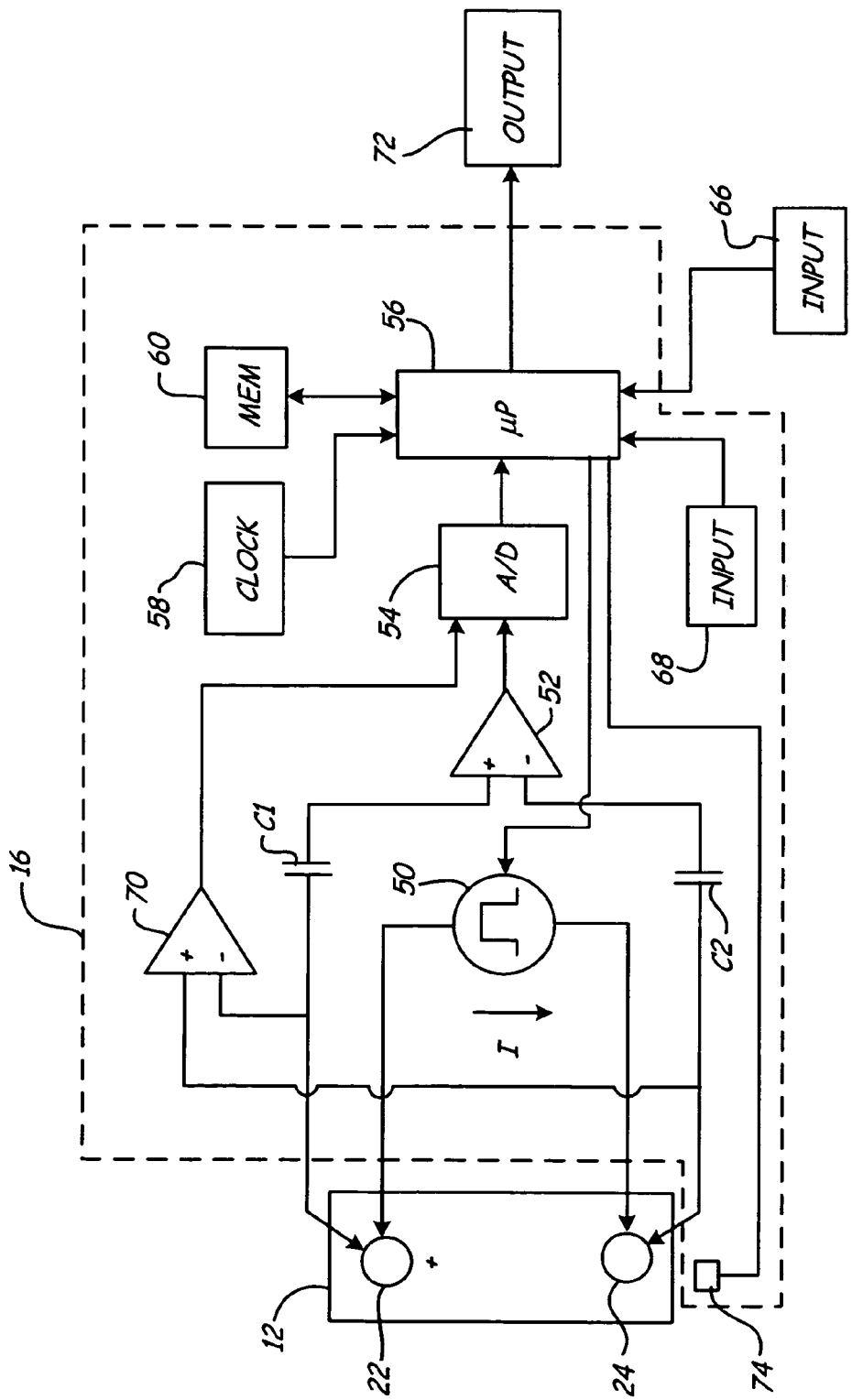
FIG. 1 is a simplified schematic diagram showing battery test circuitry in accordance with the present invention.

FIG. 1 is a simplified block diagram of battery test circuitry 16 in accordance with an embodiment of the present invention. Apparatus 16 is shown coupled to battery 12, which includes a positive battery terminal 22 and a negative battery terminal 24. Battery 12 may be a JIS rated battery or a non-JIS rated battery such as a CCA rated battery.

In preferred embodiments, circuitry 16 operates, with the exceptions and additions as discussed below, in accordance with battery testing methods described in one or more of the United States patents obtained by Dr. Champlin and Midtronics, Inc. and listed above. Circuitry 16 operates in accordance with one embodiment of the present invention and determines the conductance (G) of battery 12, the open circuit voltage (OCV) between terminals 22 and 24 of battery 12 and the bounceback voltage (change in voltage after the battery is initially released from a load until some time later (for example, 3 seconds)) of battery 12. Circuitry 16 includes current source 50, differential amplifier 52, analog-to-digital converter 54 and microprocessor 56. Amplifier 52 is capacitively coupled to battery 12 through capacitors $C_1$ and $C_2$. Amplifier 52 has an output connected to an input of analog-to-digital converter 54. Microprocessor 56 is connected to system clock 58, memory 60 and analog-to-digital converter 54. Microprocessor 56 is also capable of receiving an input from input devices 66 and 68. Microprocessor 56 also connects to output device 72.

In operation, current source 50 is controlled by microprocessor 56 and provides a current I in the direction shown by the arrow in FIG. 1. In one embodiment, this is a square wave or a pulse. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Circuitry 16 includes differential amplifier 70 having inverting and noninverting inputs connected to terminals 24 and 22, respectively. Amplifier 70 is connected to measure the OCV of battery 12 between terminals 22 and 24. The output of amplifier 70 is provided to analog-to-digital converter 54 such that the voltage across terminals 22 and 24 can be measured by microprocessor 56.

Circuitry 16 is connected to battery 12 through a four-point connection technique known as a Kelvin connection. This Kelvin connection allows current I to be injected into battery 12 through a first pair of terminals while the voltage V across the terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 12 by applying a current pulse I using current source 50. The microprocessor determines the change in battery voltage due to the current pulse I using amplifier 52 and analog-to-digital converter 54. The value of current I generated by current source 50 is known and is stored in memory 60. Microprocessor 56 calculates the conductance of battery 12 using the following equation:

$$\text{Conductance} = G = \frac{\Delta I}{\Delta V} \qquad \text{Equation 1}$$

where $\Delta I$ is the change in current flowing through battery 12 due to current source 50 and $\Delta V$ is the change in battery voltage due to applied current $\Delta I$. In a preferred embodiment of the present invention, the temperature of battery 12 is input by a tester user through input 66, for example. In other embodiments circuitry 16 also includes a temperature sensor 74, coupled to microprocessor 56, that can be thermally coupled to battery 12 to thereby measure a temperature of battery 12 and provide the measured battery temperature value(s) to microprocessor 56. In one embodiment, the battery temperature is measured using an infrared signal from the outside of the battery. Microprocessor 56 can also use other information input from input device 66 provided by, for example, an operator. This information may consist of the particular type of battery, location, time, the name of the operator, battery group size number, battery temperature, etc.

Under the control of microprocessor 56, battery tester 16 estimates a load voltage of battery 12 as a function of the battery conductance G (Equation 1), the OCV, the resistance of the simulated tester load and the battery temperature. Further, battery tester 16 predicts, as mentioned above, a bounceback voltage of the battery. The bounceback voltage, the load voltage and the battery temperature are utilized by microprocessor 56 of battery tester 16 to rate the strength of the battery by categories of JIS group size numbers. Details regarding the derivation of an example algorithm utilized by battery tester 16 to estimate the bounceback voltage and load voltage of battery 12 are provided below. The algorithm included below was derived by analyzing a popular Japanese battery load tester.

Analysis of Japanese Load Tester

The Japanese load tester requires the user, after connecting the cable clamps to a battery, to input the size of the battery and the temperature. The user then pushes a start button. The tester puts a load on a battery for 5-6 seconds and then records the load voltage (LV). It then looks at the bounceback or recovery voltage 2.5 seconds later and makes a decision about the battery.

As mentioned above, the user inputs battery size. Specifically, batteries are input in 10 group size ranges (0-9) that go in increasing cranking power range. Each range, however, is strictly associated with various JIS battery numbers printed on the tester(s). Table 1 below shows the different group size ranges.

TABLE 1

| Group Size | JIS BATTERY NUMBER | Cold Cranking Amp (CCA) range |
|---|---|---|
| 0 | 26A17, 26A19, 26B17, 28A19, 28B17, 28B19, 32C24 | 200-250 CCA |
| 1 | 30A19, 32A19, 34A19, 34B17, 34B19, 36B20, 48B26 | 251-300 CCA |
| 2 | 38B19, 40B19, 38B20, 40B20, 46B24, 50D20, 55D26 | 301-350 CCA |
| 3 | 42B19, 42B20, 44B19, 50B24, 55D23, 65D31 | 351-400 CCA |
| 4 | 55B24, 65D23, 65D26, 75D31 | 401-450 CCA |
| 5 | 60B24, 70D23, 75D23, 75D26, 80D23, 80D26, 85D31, 95E41, 100E41, 105E41, 110E41 | 451-600 CCA |
| 6 | 90D26, 95D31, 105D31, 115E41, 115F51 | 601-750 CCA |
| 7 | 115D31, 120E41, 130E41, 130F51, 145F51, 145G51, 155G51 | 751-900 CCA |
| 8 | 150F51, 170F51, 165G51, 190H52 | 901-1050 CCA |
| 9 | 180G51, 195G51, 210H52, 225H52, 245H52 | 1051+ CCA |

As mentioned above, in addition to group size, the user inputs temperature. The temperature is input by the user in four ranges (shown in Table 2):

TABLE 2

| | Temperature range (degrees Celsius(° C.)) |
|---|---|
| 1 | 0 |
| 2 | 10 |
| 3 | 25 |
| 4 | "After Driving" (50) |

The tester allows the battery to be tested down to 11.5 volts (V) after recovery where it is then reported as low voltage, provided that the battery provides enough voltage to support the tester during the load. If indeed the voltage goes very low, the load tester simply resets and reports nothing.

A basic relationship between the group size (0-9) and temperature (° C.) for this type of tester follows the following relationship: Good Voltage (Vg in Volts):

$$Vg = 8.8 + 0.1 * \text{GroupSize} + 0.02 * \text{TempC} \qquad \text{Equation 2}$$

Where GroupSize=battery group size (Table 1 above)
TempC=battery temperature in degrees Celsius (Table 2 above)

Replace Voltage (Vr in Volts):

$$Vr = Vg - 0.3 \qquad \text{Equation 3}$$

However, because the battery may be discharged or have other problems, the measured recovery or bounceback voltage (BBV) is assessed and combined with the group size criteria and temperature gives the following (shown in Table 3 below):

TABLE 3

| Comparison | Result |
|---|---|
| LV >= Vg AND BBV >= 11.5 V | Good |
| LV < Vg AND LV >= Vr AND BBV >= 11.5 V | Replace Soon |
| LV < Vr AND LV >= 7 V AND BBV >= 11.5 V | Replace |
| LV >= Vr AND LV < Vg AND BBV < 11.5 V | Attention (Charge Soon) |
| LV >= 7 V AND LV < Vr AND BBV < 11.5 V | Warning (Charge and Retest) |
| LV < 7 V (Normally the tester simply resets for lack of power. In such a case the battery is retested after charging.) | Fail/Replace (Charge and Retest) |

Example Algorithm for Battery Tester of the Present Invention

As mentioned above, the battery tester of the present invention works by predicting the load voltage (LV) using measured values of the battery's OCV, conductance and temperature (measured or input by the user).

To predict the load voltage in Volts, the following relationship is used:

$$LV = Vact - I*R \qquad \text{Equation 4}$$

Where Vact=activation voltage
I=load current
R=battery resistance

The activation voltage (Vact) can be estimated by:

$$Vact = K1*OCV^2 + K2*OCV + K3*TempC - K4 \qquad \text{Equation 5}$$

where K1, K2, K3 and K4 are constants whose values are selected based upon the type of battery tester being simulated.

The battery conductance (G) is measured as described above using Equation 1. Using conductance measured at 100 Hz, the battery resistance can be estimated by:

$$R = K5/G + K6 \qquad \text{Equation 6}$$

where K5 and K6 are constants. However, because the Japanese tester uses a fixed resistor for loading, the current will vary with the resistance of the battery. Therefore, the load current must first be estimated. This can be carried out using the following relationship:

$$I = Vact/(R + R1) \qquad \text{Equation 7}$$

where R1 is the estimated resistance of the load tester in ohms.

It was generally found that the load varies between 110-160 amperes; if below 110 amperes the load tester will reset. Therefore, the load voltage can be predicted and used for assessing the battery strength.

In addition, it was found that the recovery or bounceback voltage (BBV) could be predicted with a second order equation using the open circuit voltage and the temperature:

$$BBV = K7*OCV + K8*OCV - K9 + K10*(TempC - K11) \qquad \text{Equation 8}$$

where K7, K8, K9, K10 and K11 are constants.

Therefore, using these calculations (Equations 1 and 4-8), the values attained by the Japanese load tester can be predicted without invoking a high load.

Figure 2:
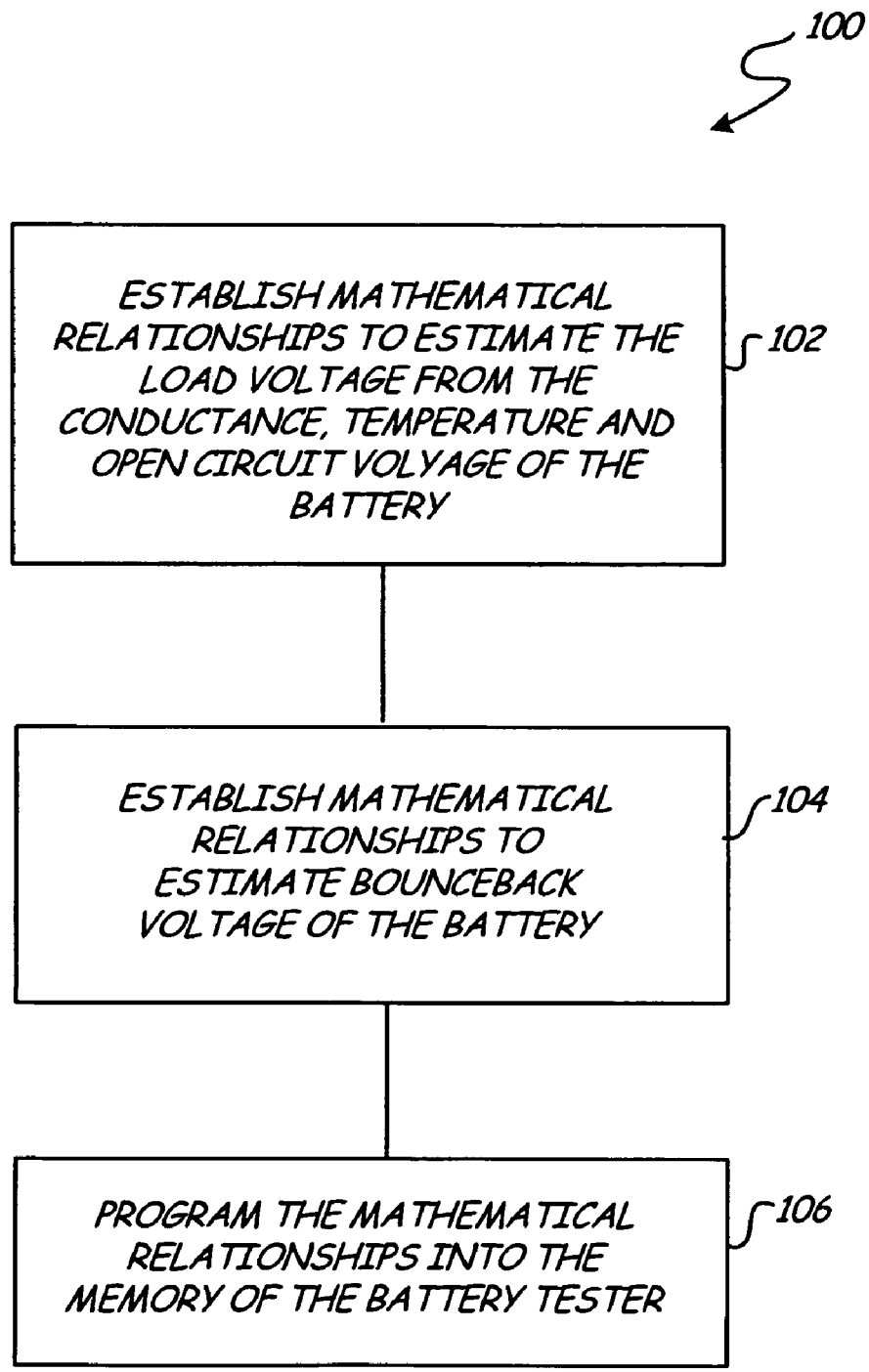
FIG. 2 is a simplified block diagram showing the steps of a method of programming a battery tester in accordance with the present invention.

FIG. 2 is a flowchart 100 showing steps of a method of programming battery tester 16 in accordance with an embodiment of the present invention. As shown in flow chart 100, at step 102, mathematical relationships to estimate the load voltage from the conductance, temperature and OCV of the battery are established (Equations 1 and 4-7 above). At step 104, a mathematical relationship to estimate bounceback voltage of the battery is established (Equation 8). At step 106, the mathematical relationships are programmed into memory 60 of battery tester 16. At this point, battery tester 16 is ready to estimate battery load voltage and bounceback voltage and to utilize the estimated bounceback voltage, the load voltage and the battery temperature to rate the strength of the battery by categories of JIS group size numbers.

Figure 3:
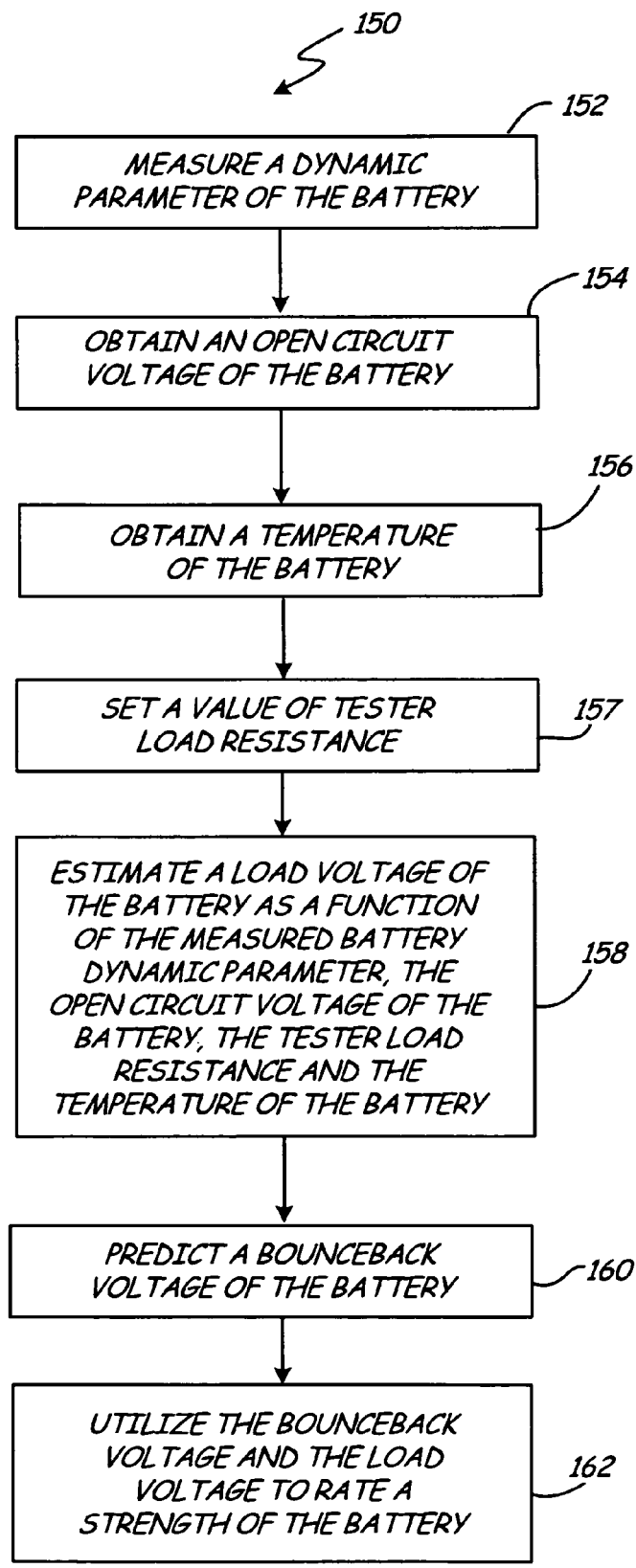
FIG. 3 is a simplified block diagram showing the steps of a method of testing a battery in accordance with the present invention.

FIG. 3 is a flowchart 150 showing steps of a method of testing a battery in accordance with an embodiment of the present invention. At step 152, a dynamic parameter of the battery is measured. At step 154, an open circuit voltage of the battery is obtained. At step 156, a temperature of the battery is obtained. At step 157, a value of tester load resistance is set. This is a predetermined load resistance value that is appropriate for a load tester being simulated. At step 158, a load voltage of the battery is estimated as a function of the measured battery dynamic parameter, the open circuit voltage of the battery, the load resistance and the battery temperature. At step 160, a bounceback voltage of the battery is predicted. At step 162, the bounceback voltage, the load voltage and the battery temperature are utilized to rate the strength of the battery by categories of JIS group size numbers. Different techniques, some of which are set forth above, can be employed to carry out the steps shown in the flow chart of FIG. 3 while maintaining substantially the same functionality without departing from the scope and spirit of the present invention.

Furthermore, because there is no load from the tester of this invention, the tester can improve upon the standard load tester by making judgements in areas that would reset the standard load tester. In particular, if the bounceback voltage is above 11.5V and the load voltage is very low (<7V), such a battery can be certain to be a cause for "Fail/Replace." If the bounceback voltage is below 11.5V, the OCV is greater than 11V and the load voltage estimate is less than Vr then a judgement can be deferred and the battery can be put in a "Charge and Retest" category. In addition, the tester can detect batteries with probable shorts by finding significant conductance when the OCV is less than 11V. These can be placed in a "Fail/Replace" category. If little conductance is present when the voltage is very low, the battery can be placed in a "Charge and Retest" category. The improved and more specific comparisons and results are provided in Table 4 below.

TABLE 4

| Comparison | Result |
| --- | --- |
| LV >= Vg AND BBV >= 11.5 V | Good |
| LV < Vg AND LV >= Vr AND BBV >= 11.5 V | Replace Soon |
| LV < Vr AND LV >= 7 AND BBV >= 11.5 V | Replace |
| LV < 7 V AND BBV >= 11.5 V | Fail/Replace |
| LV >= Vr AND LV < Vg AND BBV < 11.5 V AND OCV >= 11 V | Attention (Charge Soon) |
| LV < Vr AND BBV < 11.5 V AND OCV >= 11 V | Warning (Charge and Retest) |
| IF OCV < 11 V AND CCA >= f(GROUP SIZE) (PROBABLE SHORT) | Fail/Replace |
| IF OCV < 11 V AND CCA < f(GROUP SIZE) | Warning (Charge and Retest) |

Although the example embodiments of the present invention described above relate to estimating load voltage from battery conductance measurements, dynamic parameters other than battery conductance may be utilized without departing from the spirit and scope of the invention. Examples of other dynamic parameters include dynamic resistance, admittance, impedance, reactance, susceptance or their combinations. In preferred embodiments of the present invention, battery tester 16 is relatively small and portable.

The above embodiments of the present invention are primarily described in connection with simulating a Japanese load tester. However, the significance of this present invention is not necessarily that it mimics a Japanese tester, but that it mimics, in general, any tester with a fixed resistance load. In general, simulating a tester with a fixed resistance load is a two stage process: (1) determining what current will be drawn from the battery (Equation 7 above) and (2) determine what voltage the battery will achieve under that load (Equation 4 above). Many prior art algorithms assume that the load current is defined and then the voltage is predicted.

Additional Embodiments

The electronic battery tester embodiments described earlier are capable of simulating a load tester commonly used in the Japanese battery testing market. As described above, those battery tester embodiments are able to closely duplicate load test results without invoking an actual load.

In both load testers and the above-described simulated load tester embodiments, the accuracy of test results may sometimes be negatively impacted if the battery is substantially discharged. Therefore, in accordance with embodiments described further below in connection with FIG. 4, the earlier-described load test simulator embodiments have been modified to project the results of recharging discharged batteries without actually doing so.

The modification occurs using a function for compensation of the conductance of the battery based on its open circuit voltage and temperature (f(OCV, Temp)). Since discharged batteries normally have lower conductance readings, this function can be used to raise and project the conductance to that of a full charged battery. This projected value, coupled with a voltage of a full charged battery (which is about 12.8V in some embodiments) is entered into the algorithm described above to produce an estimate of a load voltage at full charge. A recovery or bounceback voltage is then calculated using the full charge parameters. If these two voltages in turn pass the criteria for the battery category, the battery can be judged to be good after it is properly recharged.

Figure 4:
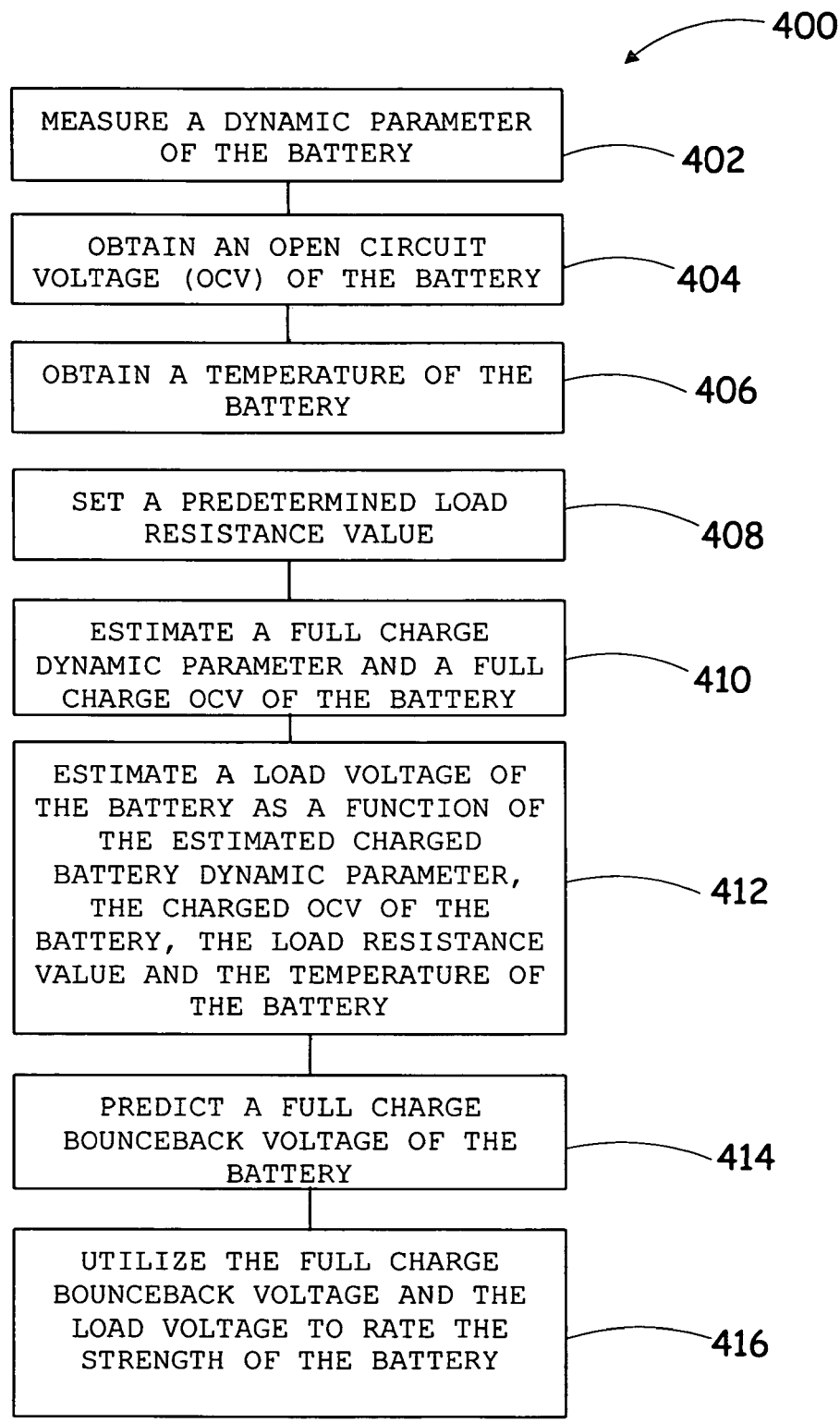
FIG. 4 is a flowchart of a load tester simulation method with discharge compensation in accordance with an embodiment of the present invention.

FIG. 4 is a flowchart 400 of a load tester simulation method with discharge compensation in accordance with an embodiment of the present invention. At step 402, a dynamic parameter of the battery is measured. At step 404, an open circuit voltage of the battery is obtained. At step 406, a temperature of the battery is obtained. At step 408, a predetermined load resistance value is set. At step 410, a full charge dynamic parameter and a full charge OCV of the battery are estimated. At step 412, a load voltage of the battery as a function of the estimated charged battery dynamic parameter, the charged open circuit voltage of the battery, the tester load resistance and the temperature of the battery is estimated. Thereafter, at step 414, a full charge bounceback voltage of the battery is predicted. At step 416, the full charge bounceback voltage and second load voltage are utilized to rate the strength of the battery.

The above method embodiment described in connection with FIG. 4 can be implemented using a battery tester similar to that shown in FIG. 1. However, to implement the embodiment of FIG. 4, microprocessor 56 is configured to operate with programming instructions, stored in memory 60, that are modified to implement the method of FIG. 4.

Although the present embodiments have been described with reference to preferred embodiments, workers skilled in the art will recognize that changes may be made in form and detail without departing from the spirit and scope of the invention.

What is claimed is:

1. A battery testing method that is based on battery rating standards, the method comprising:
   (a) measuring a dynamic parameter of the battery;
   (b) obtaining an open circuit voltage of the battery;
   (c) obtaining a temperature of the battery;
   (d) setting a predetermined load resistance value;
   (e) estimating a full charge dynamic parameter and a full charge open circuit voltage of the battery;
   (f) estimating a load voltage of the battery as a function of the estimated charged battery dynamic parameter, the charged open circuit voltage of the battery, the load resistance value and the temperature of the battery;
   (g) predicting a full charge bounceback voltage; and
   (h) utilizing the full charge bounceback voltage and the load voltage to rate the strength of the battery,
   wherein bounceback voltage is a change in voltage after the battery is initially released from a load until a later time, and
   wherein predicting the full charge bounceback voltage comprises determining the full charge bounceback voltage without subjecting the battery to a high load.

2. The method of claim 1 wherein setting the predetermined load resistance value in step (d) comprises setting the load resistance value to be appropriate for a load tester being simulated.

3. The method of claim 1 wherein the obtaining the temperature of the battery in step (c) comprises receiving the temperature of the battery as an input provided by a user.

4. The method of claim 1 wherein the obtaining the temperature of the battery in step (c) comprises receiving the temperature of the battery as an input from a temperature sensor.

5. The method of claim 1 wherein the dynamic parameter measurement in step (a) comprises determining a response of the battery to an applied current pulse.

6. The method of claim 1 wherein the measured battery dynamic parameter value is battery conductance.

7. The method of claim 1 wherein the measured battery dynamic parameter value is battery resistance.

8. An electronic battery tester comprising:
- a positive connector configured to couple to a positive terminal of the battery;
- a negative connector configured to couple to a negative terminal of the battery;
- a voltage sensor configured to measure an open circuit voltage of the battery;
- an input configured to receive a temperature of the battery; and
- battery test circuitry configured to:
  - (a) measure a dynamic parameter of the battery using the first and second connectors;
  - (b) estimate a full charge dynamic parameter and a full charge open circuit voltage of the battery;
  - (c) estimate a load voltage of the battery as a function of the estimated charged battery dynamic parameter, the charged open circuit voltage of the battery, a load resistance value and the temperature of the battery;
  - (d) predict a full charge bounceback voltage; and
  - (e) utilize the full charge bounceback voltage and the load voltage to rate the strength of the battery;
- wherein bounceback voltage is a change in voltage after the battery is initially released from a load until a later time, and
- wherein the full charge bounceback voltage is predicted by determining the full charge bounceback voltage without subjecting the battery to a high load.

9. The apparatus of claim 8 wherein the input is configured to receive the temperature of the battery from a user.

10. The apparatus of claim 8 wherein the input is configured to receive the temperature of the battery from a temperature sensor.

11. The apparatus of claim 8 wherein the battery test circuitry is configured to measure the dynamic parameter in step (a) by determining a response of the battery to an applied current pulse.

12. The apparatus of claim 8 wherein the measured battery dynamic parameter is battery conductance.

13. The apparatus of claim 8 wherein the measured battery dynamic parameter is battery resistance.

14. The apparatus of claim 8 wherein the positive connector is a first Kelvin connector and the negative connector is a second Kelvin connector.

* * * * *

UNITED STATES PATENT AND TRADEMARK OFFICE
CERTIFICATE OF CORRECTION

| | | |
|---|---|---|
| PATENT NO. | : 7,595,643 B2 | Page 1 of 1 |
| APPLICATION NO. | : 11/507157 | |
| DATED | : September 29, 2009 | |
| INVENTOR(S) | : James K. Klang | |

It is certified that error appears in the above-identified patent and that said Letters Patent is hereby corrected as shown below:

Title page item [56]

Insert the following references:

--National Semiconductor Corporation, "LMF90-4$^{th}$-Order Elliptic Notch Filter", 12/94, RRD-B30M115, December 1994.

"Notification of Transmittal of the International Search Report or the Declaration", PCT/US03/07546.

"Notification of Transmittal of the International Search Report or the Declaration", PCT/US03/06577.

"Notification of Transmittal of the International Search Report or the Declaration", PCT/US03/07837.--

Signed and Sealed this

Seventeenth Day of August, 2010

David J. Kappos
*Director of the United States Patent and Trademark Office*